United States Patent [19]

Owen

[11] Patent Number: 4,829,482
[45] Date of Patent: May 9, 1989

[54] CURRENT METERING APPARATUS FOR OPTIMALLY INDUCING FIELD EMISSION OF ELECTRONS IN TUNNELING DEVICES AND THE LIKE

[75] Inventor: William H. Owen, Mountain View, Calif.

[73] Assignee: Xicor, Inc., Milpitas, Calif.

[21] Appl. No.: 788,770

[22] Filed: Oct. 18, 1985

[51] Int. Cl.$^4$ .............................................. G11C 7/00
[52] U.S. Cl. .................. 365/189.09; 365/185; 363/60
[58] Field of Search .................. 365/185, 189; 363/60; 324/111, 120; 307/270, 296.1, 296.8; 323/312

[56] References Cited

U.S. PATENT DOCUMENTS

| | | | |
|---|---|---|---|
| 4,274,012 | 6/1981 | Simko | 365/185 |
| 4,300,212 | 11/1981 | Simko | 365/185 |
| 4,314,265 | 2/1982 | Simko | 365/185 |
| 4,486,769 | 12/1984 | Simko | 365/185 |

FOREIGN PATENT DOCUMENTS

0026419 2/1977 Japan .................. 363/60

Primary Examiner—James W. Moffitt
Attorney, Agent, or Firm—Fitch, Even, Tabin & Flannery

[57] ABSTRACT

A current metering circuit is configured as a single stage charge pump for limiting the current level applied to the tunneling regions of an integrated circuit, nonvolatile, floating gate memory cell. The current metering circuit includes a storage capacitor which has one plate pumped by a periodic signal. The other plate of the capacitor is charged from a voltage that is bootstrapped from the voltage that presently exists across the active tunneling region. More particularly, a high voltage is applied to the drain of a transistor whose gate is connected to the tunneling region. The source of this transistor is coupled to a plate of the storage capacitor. This source develops a voltage equal to the present voltage across the load less the turnon threshold of the transistor. When the periodic signal goes low, the storage capacitor is charged from the voltage appearing at the source of this transistor. When the periodic signal goes high, this transistor is biased to turn off and the capacitor discharges through a diode to develop the metered output current. The current amplitude is equal to the product of the capacitance of the storage capacitor, the change in voltage across the capacitor in each cycle and the frequency of the periodic signal.

72 Claims, 3 Drawing Sheets

CURRENT METERING APPARATUS FOR OPTIMALLY INDUCING FIELD EMISSION OF ELECTRONS IN TUNNELING DEVICES AND THE LIKE

The present invention is directed to circuits which provide an output current, and more specifically to a current metering circuit which provides a selected level of output current in response to an unknown input voltage for application to a circuit element or device having an unknown impedance.

BACKGROUND OF THE INVENTION

In one type of circuit element or device, hereinafter "tunneling device," electrons are caused to "tunnel" from a first conductor to a second conductor through an insulating dielectric separating the first and second conductors from each other. This effect is termed the Fowler-Nordheim field emission of electrons. This field emission of electrons occurs in response to a voltage difference across the dielectric by means of the application of different voltages to each conductor. When this voltage difference exceeds a threshold voltage, the Fowler-Nordheim field emission or tunneling of electrons is induced in the dielectric.

The tunneling device constitutes an unknown impedance to the applied voltage. When the voltage applied is less than the tunneling device's threshold voltage, the device acts primarily as a capacitive impedance, with charge build-up occurring at the junction between each conductor and the dielectric. However, when the threshold voltage is exceeded, the tunneling electrons induce a current through the dielectric. Thus, above the threshold voltage, the input impedance of the tunneling device also has a resistive component.

Each time an electron tunneling current is induced through the tunneling device, some of the electrons become trapped in the dielectric. As the level of trapped electrons in the dielectric increases, the threshold voltage which must be applied across the tunneling device to induce the electron tunneling current in the dielectric also increases.

In the prior art, it is common practice to apply a voltage to the tunneling device which exceeds the threshold voltage by a margin sufficient to ensure that the applied voltage will always exceed the increasing threshold voltage over the life expectancy of the tunneling device. It is to be noted that the life expectancy of a tunneling device is determined by the total amount of charge that can be passed through the dielectric before the dielectric breaks down.

A significant disadvantage and limitation of selecting a margin by which the applied voltage will exceed the threshold voltage is that, should the margin selected be either too small or too large, the number of times or cycles the tunneling device will be operable is reduced. If the margin is too small, the threshold voltage will over time approach the applied voltage such that tunneling of electrons will not occur across the dielectric. In a circuit utilizing the tunneling device, this condition will cause an operational fault. Conversely, if the margin is too large, the current density through the tunneling device will be excessive early in the expected life of the tunneling device. Since the life expectancy of the tunneling device is related to the total amount of charge that has passed through the dielectric, initial excessive current densities will cause the total charge level to be reached in fewer cycles than if the margin is optimally selected.

However, the optimal selection of the margin by which the applied voltage exceeds the threshold voltage is difficult to achieve in integrated circuits which have a tunneling device. Processing variations in the thickness of dielectric and in the amount of overlap of the first and second conductors to each other will cause the threshold voltage of the tunneling device to vary between each integrated circuit.

An electrically erasable, programmable read only memory (EEPROM) and a nonvolatile random access memory (NOVRAM) are examples of integrated circuits which have tunneling devices. In each of these memories, there is a plurality of nonvolatile memory cells. In each cell, a polysilicon floating gate is totally surrounded by a dielectric, so that the charge state of the floating gate remains undisturbed for very long periods of time in the absence of outside influences. The charge level on the floating gate, i.e., the presence or absence of excess electrons, is used to represent the storage of either binary state. Charge is applied to and removed from the floating gate through a programming tunneling region and an erase tunneling region, respectively, which are formed in the dielectric surrounding the floating gate. The position of each of these tunneling regions is defined by a separate polysilicon layer which is positioned such that it overlaps a portion of the floating gate and is spaced from the floating gate a selected distance by the dielectric.

In one embodiment of the floating gate cell, electrons are introduced onto the floating gate, in a "write" mode as follows. A low potential is applied to a programming electrode disposed adjacent to the dielectric forming the programming tunneling regions and capacitively coupled to the floating gate. The high potential is applied to a bias electrode. The bias electrode is capacitively coupled to the floating gate such that the potential of the floating gate is elevated to the high potential. Therefore, a potential difference exists over the programming tunneling region. The low and high potentials are selected so that this potential difference exceeds the tunneling threshold of the programming region so that electrons are introduced onto the floating gate.

Similarly, electrons are removed from the floating gate, in a "erase" mode, as follows. An erase electrode is disposed adjacent to the erase tunneling region and capacitively coupled to the floating gate. A low potential is applied to the bias electrode such that by capacitive coupling, the floating gate is maintained at such low potential. Upon application of a sufficiently high potential to the erase electrode, a potential difference will be developed across the erase tunneling region which exceeds the tunneling threshold voltage. Electrons will then be removed from the floating gate to the erase electrode.

As described hereinabove, the voltage required to erase or program the floating gate tends to increase as a function of the number of programming or erase cycles of the floating gate because of trapped electrons in the dielectric. In the prior art, the high potential used to induce tunneling was selected to be much higher than desirable initially in the life of the nonvolatile memory cell. Even after the cell has been cycled many times, the high potential would still cause the voltage across the tunneling regions to exceed the threshold voltage required to adequately erase or program the floating gate.

The maximum number of erase/program cycles, i.e., the endurance of a nonvolatile memory cell, is directly related to the total charge that can be passed through the erase and program tunneling regions. Decreasing the current density or the rate at which the charge is passed through these tunneling regions increases the number of erase/program cycles possible in a given cell. Consequently, applying a higher than necessary voltage initially to the tunneling regions in a nonvolatile memory cell produces a higher than necessary current density in the tunneling region during the first cycles, thereby significantly reducing the endurance of the nonvolatile memory cell.

In nonvolatile integrated circuit memory devices as described above, the high potential applied to each cell to induce tunneling is generated "on-chip" from the normal 5 volt logic level voltage input to the chip. Because of processing variations between chips, the level of this high potential is not readily controlled to a degree required to optimize the voltage and current densities in the tunneling regions. These processing variations render the input impedance of each tunneling device to be relatively unknown, in addition to being non-linear. Also, because of mismatches between each tunneling region on the same chip, the on-chip generated high potential cannot be optimized for each region. Furthermore, the polysilicon layer forming part of the erase tunneling device in each memory cell may be common to several cells to form, for example, a word line. Thus, the on-chip generated high potential cannot be satisfactorily optimized for all these variations.

SUMMARY OF THE INVENTION

It is therefore an object of the present invention to provide a novel current metering apparatus for developing a selected level of output current for application to a load having an unknown input impedance in response to an unknown input voltage.

A further object of the present invention is to provide a novel current metering apparatus which is easily integratable into known integrated circuit nonvolatile memory devices.

Still another object of the present invention is to create, independent of the input high voltage, a current that is coupled to one or more tunneling regions which is constant at a level which creates just enough voltage such that the threshold voltage required to create tunneling is exceeded.

According to the present invention, a circuit responsive to an unknown input voltage for developing a selected level of current for application to a load having an unknown impedance includes means for developing a first voltage from the input voltage as a function of the present voltage across the load, means for storing a quantum of charges as a function of the first voltage in response to the first state of a periodic signal and for discharging a portion of this charge as a function of the peak-to-peak voltage of the periodic signal when it is in its second state, and means for coupling this charge portion to the load to develop the output current. Since the portion of charge discharged is a function of both the stored charge and the peak-to-peak voltage of the periodic signal, and further since the stored charge is a function of the present voltage across the load, the current developed during each second state of the periodic signal is constant.

For example, in one particular embodiment of the present invention, the storing means includes a storage capacitor. The periodic signal is applied to a first plate of the storage capacitor. When the periodic signal is in its low state, the above described first voltage is applied to the second plate of the storage capacitor to store charge thereon. The first voltage is developed to be substantially equal to the present output voltage across the load. When the periodic signal goes high, the first voltage is removed from the second plate of the storage capacitor and the second plate becomes coupled to the load through a diode. Hence, during the transition between the low state and high state of the periodic signal, the voltage at the second plate of the capacitor remains substantially equal to the present voltage across the load. However, the voltage at the first plate is elevated by the peak-to-peak voltage of the periodic signal. Thus, the change of voltage, $\Delta V$, across the capacitor is equal to the peak to peak voltage of the periodic signal. Furthermore, this change of voltage must cause some of the charge to be discharged to the load as the output current, $i_o$. Mathematically, the output current $i_o$ is given by $i_0 = C\Delta Vf$, where C is the capacitance of the storage capacitor and f is the frequency of the periodic signal. Since each of these factors is constant, as well as $\Delta V$, the output current developed on each high state of the periodic signal will also have a constant amplitude.

The metered output current feature of the present invention finds particular usefulness in the integrated current nonvolatile memory devices described above. In this aspect of the present invention, the current metering apparatus is disposed between the high voltage source and one or more of the nonvolatile memory cells, each of which have a tunneling region. In the prior art, this high voltage was directly coupled to the tunneling region to induce electron tunneling, and was accordingly selected to exceed the expected threshold voltage of the tunneling regions over the life expectancy of the memory device. With the present invention, the high voltage is used to develop the above described first voltage to charge the storage capacitor. On each high state of the periodic signal, the charge discharged from the capacitor is applied to the tunneling region. Initially, this output current pulse increments the voltage across the tunneling region since below the threshold voltage, the tunneling region has primarily a capacitive impedance. When the threshold voltage is reached, the current density through the tunneling region is determined by the metered output current developed in accordance with the present invention. Therefore, the voltage across the tunneling region is limited to substantially the threshold voltage, thereby avoiding voltage-induced, excessive current densities in the tunneling region. Furthermore, the current density through the tunneling region may be preselected as described above as a function of the product of the capacitance of the storage capacitor, the peak-to-peak voltage of the period signal and the frequency thereof.

These and other advantages, objects, and features of the present invention will become more apparent from the following specification when read in conjunction with the accompanying drawings and the appended claims.

DETAILED DESCRIPTION OF THE PREFERRED EMBODIMENT

Figures 1, 2, 5A, 5B:
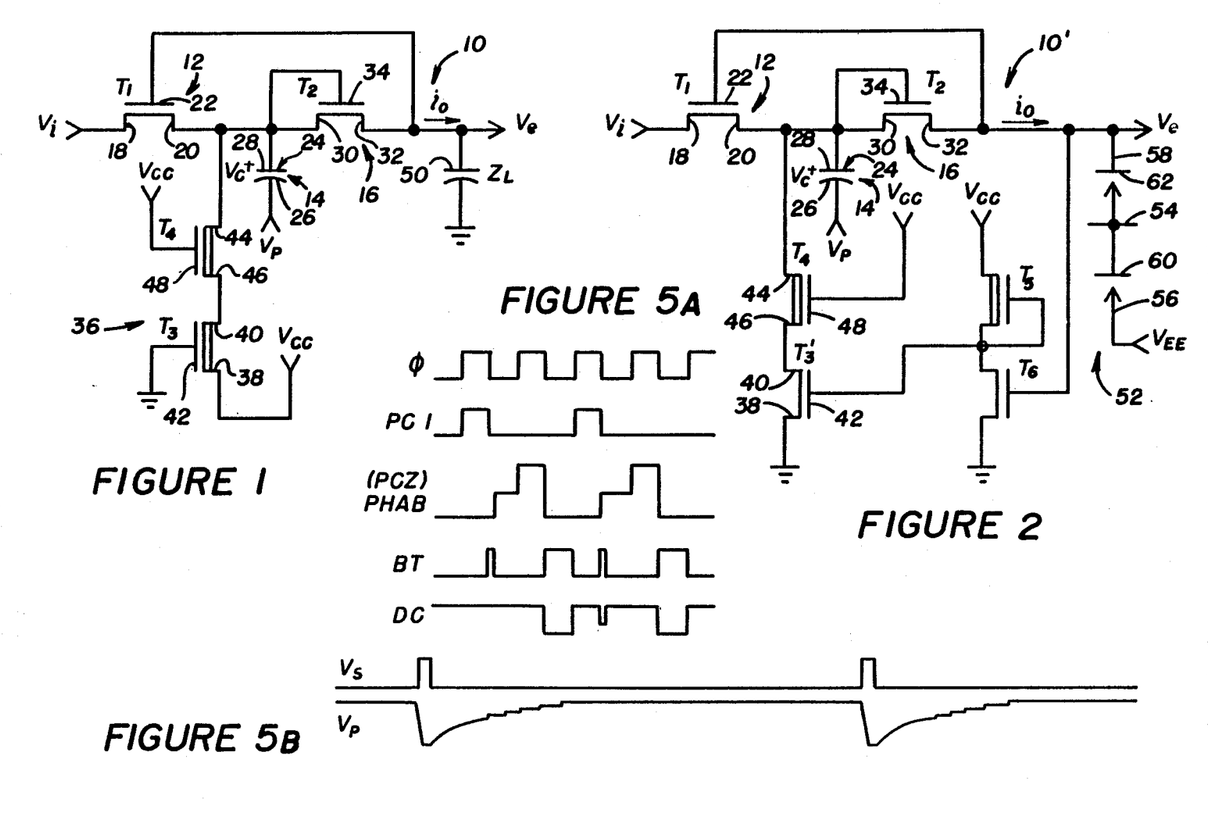
FIG. 1 illustrates a novel current metering circuit according to the present invention.
FIG. 2 is a low power alternate embodiment of the circuit of FIG. 1 useful in integrated circuits.
FIGS. 5A and 5B are timing diagrams associated with the operation of the circuit of FIG. 4.

Referring now to FIG. 1 there is shown one embodiment of a current metering circuit 10 according to the present invention. The current metering circuit 10 develops an output current $i_o$ in response to an unknown input high voltage $v_i$. The output current $i_o$ develops a voltage $v_1$ across a load having an unknown impedance. As will be described in greater detail below, the current metering circuit 10 develops the output current $i_o$ independent of the level of the input voltage $v_i$ as long as $v_i$ is equal to or greater than $v_1$, and this current is also independent of the impedence of the load.

The current metering circuit 10 includes a means 12 for developing a first voltage from the input voltage $v_i$ as a function of the present voltage $v_1$ across the load, and a means 14 for storing a quantum of charge as a function of the first voltage. The storing means 14 is responsive to a periodic signal $v_p$ having a first state and a second state. When the periodic signal $v_p$ is in the first state, the quantum of charge is stored in storing means 14. The storing means 14 is further responsive to the second state of the periodic signal $v_p$ for discharging a portion of the stored charges as a function of the peak-to-peak voltage of the periodic signal $v_p$.

The current metering circuit 10 further includes a means 16 for coupling the discharged portion of the charge to the load. Since the stored charge is a function of the present load voltage $v_1$ and the discharged portion thereof is a function of the peak-to-peak voltage of the periodic signal $v_p$, the output current developed will have a constant level.

The developing means 12 includes a first transistor $T_1$ having a drain 18, a source 20 and a gate 22. The input voltage $v_i$ is applied to the drain 18 of the first transistor $T_1$. The present output voltage $v_1$ is applied to the gate 22 of the first transistor $T_1$. When the periodic signal $v_p$ is in the first state, the first transistor $T_1$ is caused to turn on, whereby the voltage at its source 20 begins to rise. When the gate to source voltage of the first transistor $T_1$ approaches the enhancement threshold voltage of $T_1$, the first transistor $T_1$ will turn off.

The storing means 14 includes a storage capacitor 24 having a first plate 26 and a second plate 28. The periodic signal $v_p$ is applied to the first plate 26. The second plate 28 is coupled to the source 20 of the first transistor $T_1$. The coupling means 16 includes a second transistor $T_2$ having a drain 30, a source 32 and a gate 34. The drain 30 and the gate 34 of the second transistor $T_2$ are coupled to each other and to the second plate 28 of the storage capacitor 24. The source 32 of the second transistor $T_2$ develops the output current $i_o$ for application to the load. During the second state of the periodic signal $v_p$, the second transistor $T_2$ is caused to turn on so that the discharged portion of the stored charge is coupled to the load. Since the gate 34 and drain 30 of the second transistor $T_2$ are coupled to each other, the second transistor acts as a diode between the second plate 28 of the storage capacitor 24 and the load. As described in greater detail hereinbelow, the second state of the periodic signal $v_p$ elevates the voltage at the first plate 26 of the storage capacitor 24. This also elevates the voltage of the second plate 28 of the storage capacitor 24 to achieve the diode action of the second transistor $T_2$.

When the periodic signal $v_p$ goes low, i.e. in its first state, the storage capacitor 24 is charged by the voltage appearing at its second plate 28. This voltage is determined by the source 20 of the first transistor $T_1$. So long as the input voltage $v_i$ is greater than or equal to $v_1$, when the first transistor $T_1$ is turned on the maximum voltage that can appear at its source 20 is equal to the voltage $v_1$ across the load less the turn-on threshold voltage $V_T$ of the first transistor $T_1$. As long as the low, or first, state of the periodic signal $v_p$ is less than the voltage developed at the source 20 of the first transistor $T_1$, the first transistor $T_1$ will always turn on during each low state to charge the storage capacitor 24 to a voltage $v_c$ equal to the voltage $v_1$ across the load less the turn-on threshold voltage $V_{T1}$ of the first transistor $T_1$, or $v_c = v_1 - V_{T1}$. Thus, the first voltage, i.e. the voltage developed by the source 20 of the first transistor $T_1$, is substantially equal to the present voltage $v_1$ across the field.

When the periodic signal $v_p$ goes high, i.e., in its second state, the voltage at the source 20 of the first transistor $T_1$ is elevated by the peak-to-peak voltage of the periodic signal $v_p$ causing the first transistor $T_1$ to turn off and the second transistor $T_2$ to turn on. After the second transistor $T_2$ turns on, the voltage at the second plate 28 of the storage capacitor 24 cannot exceed the voltage $v_1$ across the load plus the turn-on threshold voltage $V_{T2}$ of the second transistor $T_2$ because of the diode effect of the second transistor $T_2$. Therefore, the capacitor 24 must discharge a portion of the quantum of charge stored thereon. This discharged portion of the charge is coupled through the second transistor $T_2$ to develop the output current $i_o$. The output current $i_o$ can be expressed as:

$$i_o = Cf\Delta V,$$

where $\Delta V$ is the peak-to-peak voltage of the periodic signal $v_p$, f is the frequency of the periodic signal $v_p$, and C is the capacitance of the storage capacitor 24.

The current metering circuit 10 further includes means 36 for pre-biasing the second plate 28 of the storage capacitor 24 to a positive voltage when the voltage $v_1$ across the load is zero in order to prevent $T_1$ from turning on. With a load voltage $v_1$ of zero and no charge on the storage capacitor 24, the first transistor $T_1$ would turn on slightly and current would flow from $V_i$ to the second plate 28 of the storage capacitor 24.

Pre-biasing means 36 includes a third transistor $T_3$ and a fourth transistor $T_4$. The third transistor $T_3$ includes a drain 38, a source 40 and a gate 42. The drain 38 of the third transistor $T_3$ has the supply voltage $V_{cc}$ applied thereto. The gate 42 of the third transistor $T_3$ is grounded. The third transistor $T_3$, being a depletion mode transistor, therefore develops a voltage at its source 40 which is one depletion threshold voltage above ground, and then cuts off, or approximately one volt. This one volt allows the storage capacitor 24 to be charged during the low state of the periodic signal $v_p$ prior to any voltage $v_1$ being developed across the load. The voltage at the source 40 of the third transistor is coupled through the third transistor $T_3$ to the first plate 26 of the capacitor 24.

The fourth transistor $T_4$ includes a drain 44, a source 46 and a gate 48. The upper supply voltage $V_{cc}$ is applied to the gate 48 of the fourth transistor $T_4$. The source 46 thereof is coupled to the source 40 of the third transistor $T_3$. The drain 44 of the fourth transistor $T_4$ is coupled to the second plate 28 of the capacitor 24. The fourth transistor $T_4$ acts to prevent excessively high drain voltages on drain 42 of the third transistor $T_3$ to prevent excess current in the third transistor $T_3$ when the voltage developed at the source 20 of the first transistor $T_1$ goes high. Also, since the supply voltage $V_{cc}$ is applied to the gate 48 of the fourth transistor $T_4$, the gated diode breakdown of $T_4$ is raised by five volts and allows the source 20 of the first transistor $T_1$ to be pumped to five volts above gated diode breakdown. If gate 48 were tied to ground instead of $V_{cc}$, then gated diode breakdown would occur at 20V instead of about 25V and thereby limit the voltage available to the load, i.e. it would stop current metering at a lower than desired voltage. The voltage buffering occurs since the source 40 of third transistor $T_3$ never goes above the supply voltage plus one threshold depletion voltage, whereas the voltage developed at the source 20 of the first transistor may go relatively higher, such as 25 to 35 volts.

Initially, a low voltage will exist across the load, the load being represented by a load capacitor 50 having an impedance $Z_L$. The second plate 28 of the storage capacitor 24 is pre-biased to one depletion threshold above the supply voltage $V_{cc}$ by pre-biasing means 36 as hereinabove described. With the periodic signal $v_p$ in its low, or first, state, the storage capacitor 24 will be charged from this pre-bias voltage. When the periodic signal $v_p$ goes high, the second transistor $T_2$ turns on, thereby causing a portion of the stored charge to be disclosed therethrough to develop the output current $i_o$. The output current $i_o$ charges the load capacitor 50 to develop the output voltage $v_1$.

To initiate the next cycle the periodic signal $v_p$ goes low, lowering the voltage at the source 20 of the first transistor $T_1$ allowing the first transistor $T_1$ to turn on so that the source 20 develops a voltage which is one threshold voltage below the output load voltage $v_1$ as described above. Again, the periodic signal $v_p$ goes high elevating the voltage at the source 20 of the first transistor turning such transistor off and discharging a portion of the stored charge through the second transistor $T_2$, thereby elevating the voltage $v_1$ across the load capacitor 50.

The current metering circuit 10 operates as a single stage charge pump which self-boosts itself from the output voltage $v_1$ so that the level of the output current $i_o$, each time the periodic signal $v_p$ goes high, is always constant. Each time the periodic signal $v_p$ goes low, the voltage $V_c$ across the storage capacitor 24 is substantially equal to the voltage across the load. The actual voltage $V_c$ across the storage capacitor is one enhancement threshold less than the present voltage across the load. When the periodic signal goes high, the voltage at the first plate 26 of the storage capacitor is raised by a constant, the peak-to-peak voltage of the periodic signal $v_p$. Since the voltage at the second plate 28 of the storage capacitor 24 cannot exceed the present voltage $v_1$ across the load plus the turn-on threshold voltage of the transistor $T_1$, the change of voltage across the storage capacitor 24 is equal to the peak-to-peak voltage of the period signal. Therefore, it should be obvious to one skilled in the art that the charge transfer between the storage capacitor and the load develops an output current $i_o$ having a constant level at each cycle since the change of stored charge on the storage capacitor 24 is proportional to the change of voltage across the storage capacitor.

Referring now to FIG. 2, there is shown alternate current metering circuit 10' which has two additional transistors $T_5$ and $T_6$. The alternate embodiment current metering circuit 10' finds particular usefulness in an integrated circuit nonvolatile memory device. Such a nonvolatile memory device has a plurality of nonvolatile memory cells. One such nonvolatile memory cell 52 is diagrammatically illustrated in FIG. 2. The nonvolatile memory cell 52 includes a floating gate 54, a programming electrode 56 and an erase electrode 58. The floating gate 54 and the programming electrode 56 are insulated from each other by a dielectric to form a first tunneling element 60. Similarly, the dielectric insulating the floating gate 54 from the erase electrode 58 forms a second tunneling region 62.

Such nonvolatile memory cells may be coupled along a word line such that the source 32 of the second transistor $T_2$ will develop the output current $i_o$ to a plurality of nonvolatile memory cells.

The fifth transistor $T_5$ and the sixth transistor $T_6$ form an inverter circuit which prevents the depletion current flow through the third transistor $T_3$ in all unselected word lines to reduce power. When the word line, coupled to source 32 of the second transistor $T_2$ is deselected, or grounded, the sixth transistor $T_6$ is turned off, raising the voltage at the gate 42 of the third transistor $T_3'$ high. When $T_3'$ turns on, the voltage at the second plate 28 of the storage capacitor 24 is thereby grounded. This ensures that the first transistor $T_1$ is always turned off to isolate the word line voltage supply $v_i$ from unselected cells.

Otherwise, when the word line connected to the source 32 of the second transistor $T_2$ is selected, the sixth transistor $T_6$ is allowed to turn on thereby grounding the gate 42 of the third transistor $T_3'$. This allows the voltage at the second plate 28 of the storage capacitor 24 to be pumped as herein above described.

Figure 3:
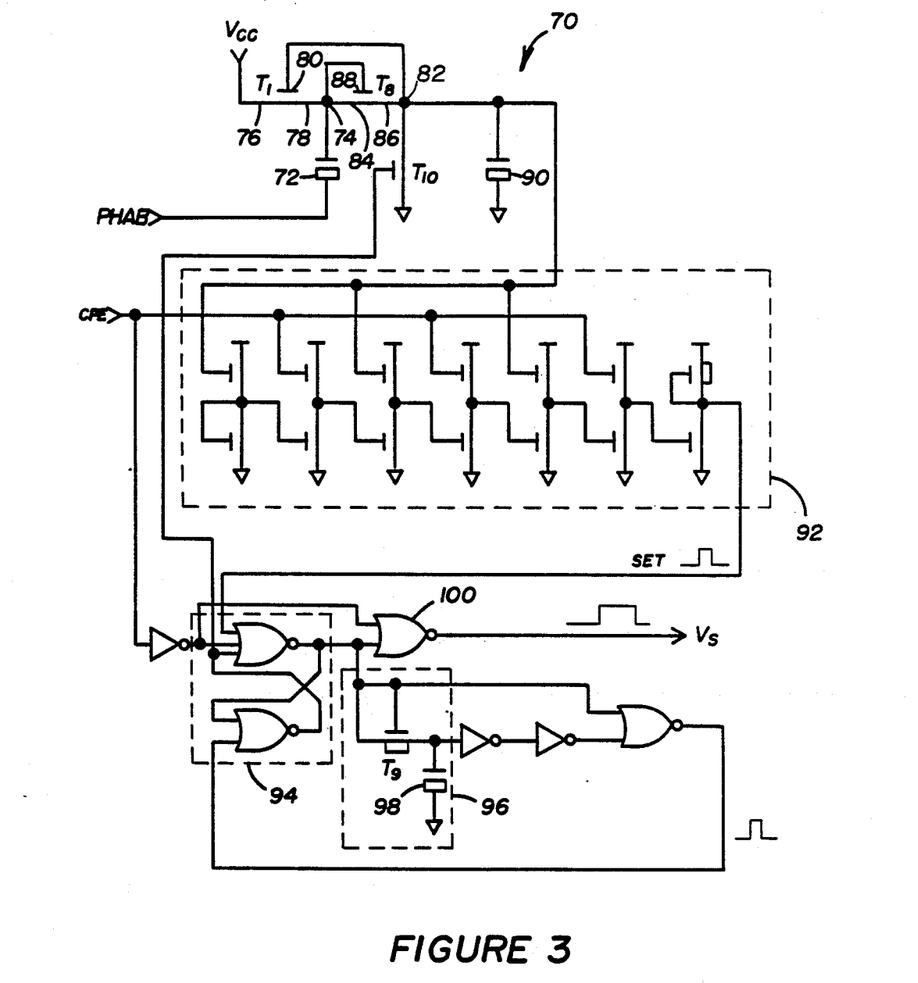
FIG. 3 is an auxiliary circuit for generating a slow phase clock useful in practicing the present invention.

Referring now to FIG. 3, there is shown a low frequency generator circuit 70. The circuit 70 is designed for fabrication in an integrated circuit. PHAB is a high frequency clock signal which may be generated externally of the integrated circuit by the system clock or internally within the chip. In a preferred embodiment of the present invention, it is desirable that the high frequency clock PHAB signal be generated on chip. For example, the high frequency PHAB clock signal may be generated by an integrated circuit ring oscillator (not shown).

PHAB continuously pumps a capacitor 72 to supply a current to a first node 74. Coupled between the first node 74 and the supply voltage $V_{cc}$ is a transistor $T_7$ having a drain 76 adapted for being coupled to the supply voltage $V_{cc}$, a source 78 coupled to node 74 and a gate 80 coupled to a second node 82. A further transistor $T_8$ has a drain 84 coupled to the first node 74, a source 86 coupled to the second node 82 and a gate 88 coupled to the first node 74. It should be apparent to one skilled in the art, that the circuit including the transistors $T_7$ and $T_8$ and the capacitor 72 is similar to a single stage charge pump as hereinabove described. Also coupled to the second node 82 is a capacitor 90. The high frequency PHAB clock signal is bootstrapped such that the bootstrap voltage developed across the capacitor 90 substantially offsets the effective two diode drops occurring in the transistors $T_7$ and $T_8$. Thus, the effective voltage stored by the capacitor 90 is substantially equal to the supply voltage $V_{cc}$.

Starting at 0 volts across the capacitor 90, the number of cycles of the high frequency clock PHAB required to pump the second node 82 to $V_{cc}$ is substantially equal to the ratio of the capacitance of the capacitor 90 to the capacitance of the capacitor 72. When the second node 82 reaches $V_{cc}$ a 6-stage differential comparator 92 switches and sends a set pulse to an RS flip-flop 94.

An RC delay circuit 96, including a transistor $T_9$ and a capacitor 98, provides a selected delay time. At the expiration of this delay time, a pulse is generated to reset the flip-flop 94. When the flip-flop 94 is reset, a transistor $T_{10}$ turns on to discharge the capacitor 90 so that the next charge pump cycle can begin. The low frequency signal is developed by a gate 100 in response to the switching between the set and reset output states of the flip-flop 94. CPE is the charge pump signal and is at a logic high level whenever the charge metering circuitry is to be active. It is low when the metering circuitry is not activated to save power.

Although the signal developed by gate 100 is suitable to drive the first plate 26 of the storage capacitor 24, in an integrated circuit memory device a large driver must be added to handle all of the capacitance of all the current metering circuits 10 on each word line in an array.

Figure 4:
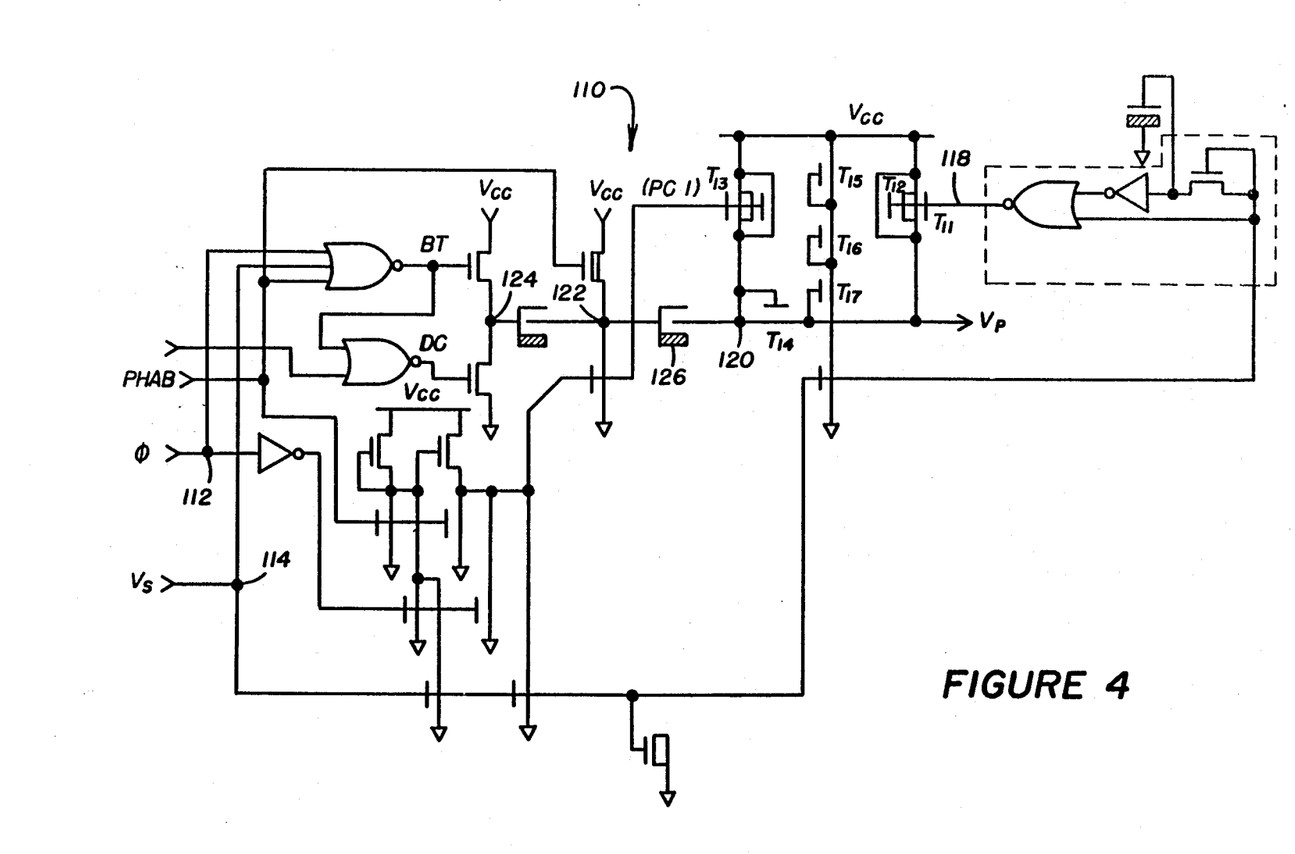
FIG. 4 is an auxiliary circuit responsive to the slow phase clock useful in practicing the present invention.

Accordingly, in FIG. 4, there is shown one such driver circuit 110. The driver circuit 110 is responsive to a high frequency square wave applied to a node 112 and the low frequency pulse $v_s$ developed by the gate 100 applied to a node 114. The high frequency square wave is at twice the frequency of the PHAB clock signal. The low frequency pulse $v_s$ discharges the output $V_p$ to ground while the low frequency pulse $v_s$ is high. The low frequency pulse $v_s$ then goes low. The low going edge on the low frequency pulse $v_s$ generates a pulse at a node 118 charging output $V_p$ up initially to approximately $V_{cc}$ through transistors $T_{11}$ and $T_{12}$. The node 118 remains low thereby keeping transistors $T_{11}$ and $T_{12}$ in the off state such that the rest of the circuit can pump the output $V_p$ up to a higher voltage than $V_{cc}$.

The signal PC1 precharges a node 120 to $V_{cc}$ by means of transistors $T_{13}$ and $T_{14}$. The nodes 122 and 124 are at ground level. The signal PHAB drives the node 122 to $V_{cc}$. This causes a capacitor 126 to pump charge through the diode connected transistor $T_{14}$ and thus pumps $V_p$ slightly above $V_{cc}$. Finally, node 124 rises to $V_{cc}$ boosting node 122 above $V_{cc}$ which in turn boosts $V_p$ through transistor $T_{14}$ again above its last value.

While the signal $V_s$ remains low, this process repeats each time raising the voltage on $V_p$ a small amount as best seen in FIG. 5B. The maximum amplitude of $V_p$ is limited to 3 enhancement threshold voltages above $V_{cc}$ by diode connected transistors $T_{15}$, $T_{16}$ and $T_{17}$. After approximately 30 repetitions of this double boost scheme, $V_s$ goes high discharging $V_p$ to ground. Referring also to FIG. 5A, the various signals referred to in the description of the circuit of FIG. 4 are shown with their relative timing to each other. It would be within the ordinary state of the art to generate a phase pulse in a number of conventional ways so as to practice the present invention.

Although the present invention has been described above utilizing n-channel technology, it is within the ordinary skill of the art to use p-channel technology. In this regard, the voltages described above would be opposite in polarity. Also, the devices disclosed in conjunction with the present invention are compatible with various integrated circuit technologies such as CMOS (including CMOS/SOS) and bipolar integrated circuit design, and may be used in integrated circuits incorporating CMOS and bipolar elements. While various other aspects of the present invention have been described with reference to a specific embodiment thereof, it will be appreciated that other variations, uses and modifications to the present invention may be made without departing from the inventive concepts described herein. Accordingly, the present invention is to be limited solely by the scope of the appended claims.

What is claimed is:

1. A circuit responsive to an unknown input voltage for developing a metered output current for application to a load having an unknown impedance, said circuit comprising:

means for developing a first voltage from said input voltage as a function of the present voltage across said load;

means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state; and means for coupling said portion of said charge to said load to develop said output current.

2. The circuit as set forth in claim 1 wherein said developing means includes a transistor having a drain, a source and a gate, said input voltage being applied to said drain, the present voltage across said load being coupled to said gate, said source developing said first voltage when said quantum of charge is being stored.

3. The circuit as set forth in claim 2 wherein said first voltage is substantially equal to the present voltage across said load.

4. The circuit as set forth in claim 2 wherein said transistor is an enhancement mode transistor.

5. The circuit as set forth in claim 1 wherein said storing means includes a capacitor having a first plate and a second plate, said periodic signal being applied to said first plate, said first voltage being applied to said second plate.

6. The circuit as set forth in claim 1 wherein said coupling means includes a transistor having a drain, a source and a gate, said portion of said charge being discharged to said drain and said gate of said transistor, said source being coupled to said load.

7. The circuit as set forth in claim 6 wherein said transistor is an enhancement mode transistor.

8. The circuit is set forth in claim 1 further including means for developing a prebias voltage, said storing means being further responsive to said prebias voltage for storing a prebias charge prior to any voltage being developed across said load.

9. The circuit as set forth in claim 8 wherein said prebias voltage developing means includes a transistor having a gate adapted for coupling to a reference voltage, a drain adapted for coupling to a supply voltage and a source, said prebias voltage being developed at said source.

10. The circuit as set forth in claim 9 wherein said transistor is a depletion mode transistor.

11. A circuit responsive to an unknown input voltage for developing a metered output current for application to a load having an unknown impedance, said circuit comprising:
   a capacitor having a first plate and a second plate;
   means for applying a periodic signal having a first state and a second state to said first plate;
   a first transistor having a gate, a source and a drain, said source being coupled to said second plate, said input voltage being coupled to said drain, said gate being coupled to said load to couple the present voltage across said load to said gate, said first transistor being conductive during said first state of said periodic signal to develop a first voltage at said source as a function of the present voltage across said load and to store a quantum of charge on said capacitor as a function of said first voltage and nonconductive during said second state of said periodic signal; and
   a second transistor having a gate, a source and a drain, said drain and said gate of said second transistor being coupled to said second plate, said source of said second transistor being coupled to said load, said second transistor being nonconductive during said first state of said periodic signal and conductive during said second state of said periodic signal, the voltage of said first plate being elevated by the peak-to-peak voltage of said periodic signal to turn said second transistor on to discharge a portion of said charge as a function of the peak-to-peak voltage of said periodic signal, said portion of said charge being coupled through said second transistor to develop said output current.

12. The circuit as set forth in claim 11 further including prebias means for initially charging said capacitor prior to any voltage being developed across said load.

13. The circuit as set forth in claim 12 wherein said prebias means includes:
   a third transistor having a gate, source and a drain, said drain being adapted for coupling to a supply voltage, said gate being adapted for coupling to a reference voltage; and
   means for coupling said source of said third transistor to said second plate of said capacitor, said supply voltage causing the voltage at said source of said third transistor to be elevated to a prebias voltage above said reference voltage.

14. The circuit as set forth in claim 13 wherein said third transistor is a depletion mode transistor.

15. The circuit as set forth in claim 14 wherein said depletion mode transistor cuts off when said prebias voltage is substantially one volt above said reference voltage.

16. The circuit as set forth in claim 13 wherein said coupling means includes a fourth transistor having a gate adapted for being coupled to said supply voltage, a source adapted to be coupled to the source of said third transistor, and a drain coupled to said second plate of said capacitor.

17. The circuit as set forth in claim 16 wherein said fourth transistor limits current from said source of said first transistor and said source of said third transistor when said first transistor is on.

18. The circuit as set forth in claim 17 wherein said fourth transistor is a depletion mode transistor.

19. A circuit responsive to an unknown input voltage for developing a metered output current for application to a tunneling device wherein said output current charges said tunneling device until the voltage across said tunneling device becomes substantially equal to a threshold voltage of said tunneling device, and further wherein said output current is coupled through said tunneling device after said output voltage crosses said threshold voltage, said circuit comprising:
   means for developing a first voltage from said input voltage as a function of the present voltage across said tunneling device;
   means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state; and
   means for coupling said portion of said charge to said tunneling device to develop said output current.

20. The circuit as set forth in claim 19 wherein said developing means includes a transistor having a drain, a source and a gate, said input voltage being applied to said drain, the present voltage across said tunneling device being coupled to said gate, said source developing said first voltage when said quantum of charge is being stored.

21. The circuit as set forth in claim 20 wherein said first voltage is substantially equal to the present voltage across said tunneling device.

22. The circuit as set forth in claim 20 wherein said transistor is an enhancement mode transistor.

23. The circuit as set forth in claim 19 wherein said storing means includes a capacitor having a first plate and a second plate, said periodic signal being applied to said first plate, said first voltage being applied to said second plate.

24. The circuit as set forth in claim 19 wherein said coupling means includes a transistor having a drain, a source and a gate, said portion of said charge being discharged to said drain and said gate of said transistor, said source being coupled to said tunneling device.

25. The circuit as set forth in claim 24 wherein said transistor is an enhancement mode transistor.

26. The circuit as set forth in claim 19 further including means for developing a prebias voltage, said storing means being further responsive to said prebias voltage for storing a prebias charge prior to any voltage being developed across said tunneling device.

27. The circuit as set forth in claim 26 wherein said prebias voltage developing means includes the transistor having a gate adapted for coupling to a reference voltage, a drain adapted for coupling to a supply voltage and a source, said prebias voltage being developed at said source.

28. The circuit as set forth in claim 27 wherein said transistor is a depletion mode transistor.

29. A circuit responsive to an unknown input voltage for developing a metered output current for application to a tunneling device wherein said output current charges said tunneling device until the voltage across said tunneling device becomes substantially equal to a threshold voltage of said tunneling device, and further wherein said output current is coupled through said tunneling device after said output voltage crosses said threshold voltage, said circuit comprising:
   a capacitor having a first plate and a second plate;
   means for applying a periodic signal having a first state and a second state to said first plate;

a first transistor having a gate, a source and a drain, said source being coupled to said second plate, said input voltage being coupled to said drain, said gate being coupled to said tunneling device to couple the present voltage across said tunneling device to said gate, said first transistor being conductive during said first state of said periodic signal to develop a first voltage at said source as a function of the present voltage across said load and to store a quantum of charge on said capacitor as a function of said first voltage and nonconductive during said second state of said periodic signal; and a second transistor having a gate, a source and a drain, said drain and said gate of said second transistor being coupled to said second plate, said source of said second transistor being coupled to said tunneling device, said second transistor being nonconductive during said firs state of said periodic signal and conductive during said second state of said periodic signal, the voltage of said second plate being charged by the peak-to-peak voltage of said periodic signal to turn said second transistor on to discharge a portion of said charge as a function of the peak-to-peak voltage of said periodic signal, said portion of said charge being coupled through said second transistor to develop said output current.

30. The circuit as set forth in claim 29 further including prebias means for initially charging said capacitor prior to any voltage being developed across said tunneling device.

31. The circuit as set forth in claim 30 wherein said prebias means includes:

a third transistor having a gate, source and a drain, said drain being adapted for coupling to a supply voltage, said gate being adapted for coupling to a reference voltage; and means for coupling said source of said third transistor to said second plate of said capacitor, said supply voltage causing the voltage at said source of said third transistor to be elevated to a prebias voltage above said reference voltage.

32. The circuit as set forth in claim 31 wherein said third transistor is a depletion mode transistor.

33. The circuit as set forth in claim 32 wherein said depletion mode transistor cuts off when said prebias voltage is substantially one volt above said reference voltage.

34. The circuit as set forth in claim 31 wherein said coupling means includes a fourth transistor having a gate adapted for being coupled to said supply voltage, a source adapted to be coupled to the source of said third transistor and a drain coupled to said second plate of said capacitor.

35. The circuit as set forth in claim 34 wherein said fourth transistor limits the voltage on said drain of said third transistor from the voltage appearing on the source of said transistor.

36. The circuit as set forth in claim 35 wherein said fourth transistor is a depletion mode transistor.

37. A circuit for developing a metered output current for application to a tunneling device independent of the present voltage across said tunneling device and the threshold voltage of said tunneling device, said circuit comprising:

charge pump means responsive to a periodic signal for storing a charge during a first half cycle of said periodic signal and for discharging a portion of said charge during a second half cycle of said periodic signal, said discharged portion of said charge being a function of the amplitude and frequency of said periodic voltage;

means for developing a first voltage as a function of the present voltage across said tunneling device for application to said charge pump means during said first half cycle of said periodic signal, said charge pump means storing said charge in response to said input voltage, the quantum of charge stored being a function of said input voltage; and means for coupling said discharged portion of said charge to said tunneling device during said second half cycle, the voltage across said tunneling device incrementally increasing during each said second half cycle of said periodic signal until said threshold voltage is reached.

38. The circuit as set forth in claim 37 wherein said charge pump means includes a capacitor having a first pate and a second plate, said periodic signal being applied to said first plate, said first voltage being applied to said second plate.

39. The circuit as set forth in claim 37 wherein said developing means includes a transistor having a drain adapted for coupling to an externally applied input voltage, a source and a gate, the present voltage across said tunneling device being coupled to said gate, said source developing said first voltage when said quantum of charge is being stored.

40. The circuit as set forth in claim 39 wherein said first voltage is substantially equal to the present voltage across said tunneling device.

41. The circuit as set forth in claim 39 wherein said transistor is an enhancement mode transistor.

42. The circuit as set forth in claim 37 wherein said coupling means includes a transistor having a drain, a source and a gate, said portion of said charge being discharged to said drain and said gate of said transistor, said source being coupled to said tunneling device.

43. The circuit as set forth in claim 42 wherein said transistor is an enhancement mode transistor.

44. The circuit as set forth in claim 37 further including means for developing a prebias voltage, said charge pump means being further responsive to said prebias voltage for storing a prebias charge prior to any voltage being developed across said tunneling device.

45. The circuit as set forth in claim 44 wherein said prebias voltage developing means includes a transistor having a gate adapted for coupling to a reference voltage, a drain adapted for coupling to a supply voltage and a source, said prebias voltage being developed at said source.

46. The circuit as set forth in claim 45 wherein said transistor is a depletion mode transistor.

47. In an integrated circuit nonvolatile electrically erasable programmable memory device having a plurality of word lines, means for selecting one of said word lines, a plurality of tunneling devices, and means for developing an input voltage selected to exceed the threshold voltage of said tunneling devices, each of said word lines being associated with selected ones of said tunneling devices, a circuit associated with each of said word lines and responsive to said input voltage for developing a metered output current for application to said tunneling devices associated with the selected one of said word lines, each said circuit comprising:

means for developing a first voltage from said input voltage as a function of the present voltage across said tunneling devices of the associated one of said word lines;

means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state;

means for coupling said portion of said charge to said tunneling devices of the associated one of said word lines to develop said output current; and means for isolating each said circuit associated with unselected ones of said word lines from said input voltage.

48. The circuit as set forth in claim 47 wherein said developing means includes a transistor having a drain, a source and a gate, said input voltage being applied to said drain, the present output voltage across said tunneling devices of the associated one of said word lines being coupled to said gate, said source developing said first voltage when said quantum of charge is being stored.

49. The circuit as set forth in claim 48 wherein said first voltage is substantially equal to the present voltage across said tunneling devices of the associated one of said word lines.

50. The circuit as set forth in claim 48 wherein said transistor is an enhancement mode transistor.

51. The circuit as set forth in claim 47 wherein said storing means includes a capacitor having a first plate and a second plate, said periodic signal being applied to said first plate, said first voltage being applied to said second plate.

52. The circuit as set forth in claim 47 wherein said coupling means includes a transistor having a drain, a source and a gate, said portion of said charge being discharged to said drain and said gate of said transistor, said source being coupled to said tunneling devices of the associated one of said word lines.

53. The circuit as set forth in claim 52 wherein said transistor is an enhancement mode transistor.

54. The circuit as set forth in claim 47 further including means for developing a prebias voltage, said storing means being further responsive to said prebias voltage for storing a prebias charge prior to any voltage being developed across said tunneling devices of the associated one of said word lines.

55. The circuit as set forth in claim 54 wherein said prebias voltage developing means includes a transistor having a gate adapted for coupling to a reference voltage, a drain adapted for coupling to a supply voltage and a source, said prebias voltage being developed at said source.

56. The circuit as set forth in claim 55 wherein said transistor is a depletion mode transistor.

57. The circuit as set forth in claim 54 wherein said isolating means includes an inverter circuit means responsive to an unselected one of said word lines for disabling said prebias voltage developing means so that said first transistor remains off.

58. In an integrated circuit nonvolatile electrically erasable programmable memory device having a plurality of word lines, means for selecting one of said word lines, a plurality of tunneling devices, and means for developing an input voltage selected to exceed the threshold voltage of said tunneling devices, each of said word lines being associated with selected ones of said tunneling devices, a circuit associated with each of said word lines and responsive to said input voltage for developing a metered output current for application to said tunneling devices associated with the selected one of said word lines, each said circuit comprising:

a capacitor having a first plate and a second plate;

means for applying a periodic signal having a first state and a second state to said first plate;

a first transistor having a gate, a source and a drain, said source being coupled to said second plate, said input voltage being coupled to said drain, said gate being coupled to said tunneling devices of the associated one of said word lines to couple the present voltage across said tunneling devices to said gate, said first transistor being conductive during said first state of said periodic signal to develop a first voltage at said source as a function of the present voltage across said tunneling devices and to store a quantum of charge on said capacitor as a function of said first voltage and nonconductive during said second state of said periodic signal;

a second transistor having a gate, a source and a drain, said drain and said gate of said second transistor being coupled to said second plate, said source of said second transistor being coupled to said tunneling devices of the associated one of said word lines, said second transistor being nonconductive during said first state of said periodic signal and conductive during said second state of said periodic signal, the voltage of said first plate being elevated by the peak-to-peak voltage of said periodic signal to turn said second transistor on to discharge a portion of said charge as a function of the peak-to-peak voltage of said periodic signal, said portion of said charge being coupled through said second transistor to develop said output current; and means for isolating each said circuit associated with unselected ones of said word lines from said input voltage.

59. The circuit as set forth in claim 58 further including prebias means for initially charging said capacitor prior to any voltage being developed across said load.

60. The circuit as set forth in claim 59 wherein said prebias means includes:

a third transistor having a gate, source and a drain, said drain being adapted for coupling to a supply voltage, said gate being adapted for coupling to a reference voltage; and means for coupling said source of said third transistor to said second plate of said capacitor, said supply voltage causing the voltage at said source of said third transistor to be elevated to a prebias voltage above said reference voltage.

61. The circuit as set forth in claim 60 wherein said third transistor is a depletion mode transistor.

62. The circuit as set forth in claim 61 wherein said depletion mode transistor cuts off when said prebias voltage is substantially one volt above said reference voltage.

63. The circuit as set forth in claim 60 wherein said coupling means includes a fourth transistor having a gate adapted for being coupled to said supply voltage, a source adapted to be coupled to the source of said third transistor and a drain coupled to said second plate of said capacitor.

64. The circuit as set forth in claim 63 wherein said fourth transistor limits the voltage on said drain of said third transistor from the voltage appearing at the source of said first transistor.

65. The circuit as set forth in claim 64 wherein said fourth transistor is a depletion mode transistor.

66. The circuit as set forth in claim 60 wherein said isolating means includes an inverter circuit associated with each said circuit, said inverter circuit developing said reference voltage so that said third transistor develops said prebias voltage when one of said word lines associated with said circuit is selected.

67. A circuit responsive to an unknown input voltage for developing a metered output current for application to a load having an unknown impedance, said circuit comprising:
   means for developing a first voltage from said input voltage as a function of the present voltage across said load, including a transistor having a drain, a source and a gate, said input voltage being applied to said drain, the present voltage across said load being coupled to said gate, said source developing said first voltage when said quantum of charge is being stored;
   means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state; and
   means for coupling said portion of said charge to said load to develop said output current.

68. The circuit as set forth in claim 67 wherein said first voltage is substantially equal to the present voltage across said load.

69. The circuit as set forth in claim 68 wherein said transistor is an enhancement mode transistor.

70. A circuit responsive to an unknown input voltage for developing a metered output current for application to a load having an unknown impedance, said circuit comprising:
   means for developing a first voltage from said input voltage as a function of the present voltage across said load;
   means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state;
   means for coupling said portion of said charge to said load to develop said output current; and
   means for developing a prebias voltage, said storing means being further responsive to said prebias voltage for storing a prebias charge prior to any voltage being developed across said load.

71. The circuit as set forth in claim 70 wherein said prebias voltage developing means includes a transistor having a gate adapted for coupling to a reference voltage, a drain adapted for coupling to a supply voltage and a source, said prebias voltage being developed at said source.

72. The circuit as set forth in claim 71 wherein said transistor is a depletion mode transistor.

* * * * *